United States Patent
Tamada et al.

(10) Patent No.: US 9,117,761 B2
(45) Date of Patent: Aug. 25, 2015

(54) POLISHING COMPOSITION AND POLISHING METHOD

(75) Inventors: Shuichi Tamada, Kiyosu (JP); Tatsuhiko Hirano, Kiyosu (JP); Takahiro Umeda, Kiyosu (JP); Kazuya Sumita, Kiyosu (JP); Yoshihiro Izawa, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 70 days.

(21) Appl. No.: 13/814,644

(22) PCT Filed: Aug. 2, 2011

(86) PCT No.: PCT/JP2011/067705
§ 371 (c)(1),
(2), (4) Date: Apr. 2, 2013

(87) PCT Pub. No.: WO2012/020672
PCT Pub. Date: Feb. 16, 2012

(65) Prior Publication Data
US 2013/0203254 A1    Aug. 8, 2013

(30) Foreign Application Priority Data

Aug. 9, 2010   (JP) ................... 2010-178613

(51) Int. Cl.
| C09K 13/00 | (2006.01) |
| H01L 21/306 | (2006.01) |
| B24B 37/04 | (2012.01) |
| C09G 1/02 | (2006.01) |
| C09K 3/14 | (2006.01) |
| H01L 21/321 | (2006.01) |

(52) U.S. Cl.
CPC ........ *H01L 21/30625* (2013.01); *B24B 37/044* (2013.01); *C09G 1/02* (2013.01); *C09K 3/1409* (2013.01); *C09K 3/1463* (2013.01); *H01L 21/3212* (2013.01)

(58) Field of Classification Search
USPC ............. 252/79.1, 79.4; 216/88, 89; 438/692, 438/693
See application file for complete search history.

(56) References Cited

U.S. PATENT DOCUMENTS

| 7,287,587 | B2 * | 10/2007 | Reddy et al. .................. 166/270 |
| 8,147,712 | B2 | 4/2012 | Etoh et al. | |
| 2004/0173120 | A1 * | 9/2004 | Tsuru et al. ................. 106/31.13 |
| 2004/0203324 | A1 * | 10/2004 | Smith et al. ..................... 451/41 |
| 2007/0269987 | A1 | 11/2007 | Nakano | |
| 2007/0272900 | A1 * | 11/2007 | Yoshida et al. ............... 252/387 |
| 2010/0155654 | A1 | 6/2010 | Etoh et al. | |

FOREIGN PATENT DOCUMENTS

| JP | 2002-110595 A | 4/2002 |
| JP | 2003-234315 A | 8/2003 |
| JP | 3666442 B2 | 4/2005 |
| JP | 2006-063201 A | 3/2006 |
| JP | 2008-041781 A | 2/2008 |
| JP | 4178500 B2 | 9/2008 |
| JP | 2008-244316 A | 10/2008 |
| TW | 200801167 A | 1/2008 |
| WO | WO 2004/100242 A1 | 11/2004 |

* cited by examiner

*Primary Examiner* — Shamim Ahmed
(74) *Attorney, Agent, or Firm* — Foley & Lardner LLP

(57) ABSTRACT

A polishing composition contains a water-soluble polymer, a polishing accelerator, and an oxidizing agent. The water-soluble polymer is a polyamide-polyamine polymer having an amine value of 150 mg KOH/1 g·solid or greater.

6 Claims, No Drawings

POLISHING COMPOSITION AND POLISHING METHOD

TECHNICAL FIELD

The present invention relates to a polishing composition used, for example, in polishing for forming wiring on a semiconductor device.

BACKGROUND ART

When wiring on a semiconductor device is formed, first, a barrier layer and a conductor layer are formed in turn on an insulator layer having trenches. Then, at least the portion of the conductor layer positioned outside the trenches (the outside portion of the conductor layer) and the portion of the barrier layer positioned outside the trenches (the outside portion of the barrier layer) are removed by chemical mechanical polishing. This polishing for removing at least the outside portion of the conductor layer and the outside portion of the barrier layer is usually performed in a first polishing step and a second polishing step. In the first polishing step, part of the outside portion of the conductor layer is removed in order to expose the upper surface of the barrier layer. In the following second polishing step, at least the remainder of the outside portion of the conductor layer and the outside portion of the barrier layer are removed in order to expose the insulator layer and obtain a flat surface.

A polishing composition used in such polishing for forming wiring on a semiconductor device generally contains a polishing accelerator, such as an acid, and an oxidizing agent, and further contains polishing abrasive grains as required. In addition, in order to improve the flatness of an object-to-be-polished after polishing, the use of a polishing composition to which a water-soluble polymer is further added has also been proposed. For example, Patent Document 1 discloses the use of a polishing composition containing an anionic surfactant, such as ammonium polyoxyethylene lauryl ether sulfate, a protective film-forming agent, such as benzotriazole, and a nonionic surfactant, such as a polyoxyethylene alkyl ether. Patent Document 2 discloses the use of a polishing composition containing an epihalohydrin-modified polyamide. Patent Document 3 discloses the use of a polishing composition containing a chemically modified gelatin having an amino group modified with a carboxylic acid.

When wiring on a semiconductor device is formed by chemical mechanical polishing, unintended inconvenient depressions may be formed on the sides of the formed traces particularly when the conductor layer is formed of copper or a copper alloy. It is considered that the depressions on the sides of traces are formed mainly because the surface of the portions of the conductor layer positioned near boundaries with the insulator layer is corroded during polishing. Even if the conventional polishing compositions as described above are used, it is difficult to prevent the depressions on the sides of the traces from being formed.

PRIOR ART DOCUMENTS

Patent Document 1: Japanese Laid-Open Patent Publication No. 2008-41781
Patent Document 2: Japanese Laid-Open Patent Publication No. 2002-110595
Patent Document 3: Japanese Laid-Open Patent Publication No. 2008-244316

SUMMARY OF THE INVENTION

Problems That the Invention is to Solve

Accordingly, it is an objective of the present invention to provide a polishing composition that can be more favorably used in polishing for forming wiring on a semiconductor device, and a polishing method using the same.

Means for Solving the Problems

To achieve the foregoing objective and in accordance with one aspect of the present invention, a polishing composition containing a water-soluble polymer, a polishing accelerator, and an oxidizing agent is provided. The water-soluble polymer is a polyamide-polyamine polymer having an amine value of 150 mg KOH/1 g·solid or greater.

The water-soluble polymer preferably contains as a comonomer a compound represented by the following general formula (I). In the general formula (I), $R_1$ and $R_3$ each independently represent a hydrogen atom or an unsubstituted or substituted straight chain alkyl group having 1 to 4 carbon atoms, and $R_2$ represents an unsubstituted or substituted straight chain alkyl group having 1 to 4 carbon atoms.

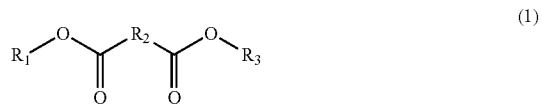

The compound represented by general formula (I) is, for example, glutaric acid or succinic acid.

The water-soluble polymer preferably contains as a comonomer a polyalkylenepolyamine in which the number of consecutive carbon atoms between nitrogen atoms is 4 or less.

The polishing composition preferably contains a compound having a triazole skeleton.

Another aspect of the present invention provides a polishing method for polishing a surface of an object-to-be-polished that includes copper or a copper alloy, using the polishing composition according to the above described aspect.

Effects of the Invention

The present invention provides a polishing composition that can be more favorably used in polishing for forming wiring on a semiconductor device, and a polishing method using the same.

MODES FOR CARRYING OUT THE INVENTION

One embodiment of the present invention will now be described.

A polishing composition in this embodiment is prepared by mixing a particular water-soluble polymer, a polishing accelerator, and an oxidizing agent, preferably with a metal anticorrosive agent and abrasive grains, into water. Therefore, the polishing composition contains a particular water-soluble polymer, a polishing accelerator, and an oxidizing agent, and preferably further contains a metal anticorrosive agent and abrasive grains.

Generally, when wiring on a semiconductor device is formed, first, a barrier layer and a conductor layer are formed in turn on an insulator layer having trenches. Then, at least the portion of the conductor layer positioned outside the trenches (the outside portion of the conductor layer) and the portion of the barrier layer positioned outside the trenches (the outside portion of the barrier layer) are removed by chemical mechanical polishing. This polishing for removing at least the outside portion of the conductor layer and the outside portion of the barrier layer is usually performed in a first polishing step and a second polishing step. In the first polishing step, part of the outside portion of the conductor layer is removed in order to expose the upper surface of the barrier layer. In the following second polishing step, at least the remainder of the outside portion of the conductor layer and the outside portion of the barrier layer are removed in order to expose the insulator layer and obtain a flat surface. The polishing composition in this embodiment is mainly used in such polishing for forming wiring on a semiconductor device, particularly polishing in the second polishing step. In other words, the polishing composition is mainly used in applications where the surface of an object-to-be-polished, having a conductor layer, is polished to form wiring on a semiconductor device. When wiring on a semiconductor device is formed by chemical mechanical polishing, unintended inconvenient depressions may be formed on the sides of the formed traces particularly when the conductor layer is formed of copper or a copper alloy. However, the polishing composition in this embodiment can inhibit the depressions on the sides of the traces from being formed. Therefore, this polishing composition is particularly useful when the conductor layer is formed of copper or a copper alloy.

(Water-Soluble Polymer)

The water-soluble polymer contained in the polishing composition serves the function of forming a protective film on the surface of the conductor layer of an object-to-be-polished, thereby inhibiting depressions from being formed on the sides of traces formed by polishing using the polishing composition. As the water-soluble polymer serving such a function, a polyamide-polyamine polymer is used.

It is considered that a polyamide-polyamine polymer is adsorbed on the surface of the conductor layer of an object-to-be-polished, using its nitrogen atoms as adsorption sites, to form a protective film. Portions having high nitrogen atom density are present in the molecule of a polyimide-polyamine polymer. Therefore, a polyamide-polyamine polymer can more reliably form a protective film on the surface of the conductor layer of an object-to-be-polished, including the portions of the conductor layer positioned near boundaries with the insulator layer, than other water-soluble polymers, such as cationized polyvinyl alcohol and cationized acrylic resins. It is considered that thus, the surface of the portions of the conductor layer positioned near boundaries with the insulator layer is not easily corroded during polishing, and as a result, the formation of depressions on the sides of traces is inhibited.

The nitrogen atom density in the molecule of a water-soluble polymer can be estimated using an amine value as an indicator. In this embodiment, a polyamide-polyamine polymer having an amine value of 150 mg KOH/1 g·solid or greater is used. When a polyamide-polyamine polymer having an amine value of less than 150 mg KOH/1 g·solid is used, it is difficult to sufficiently inhibit depressions from being formed on the sides of traces formed by polishing using the polishing composition. In order to more strongly inhibit the formation of depressions on the sides of traces, the amine value of the polyamide-polyamine polymer used is preferably 200 mg KOH/1 g·solid or greater, more preferably 250 mg KOH/1 g·solid or greater, further preferably 350 mg KOH/1 g·solid or greater, and most preferably 450 mg KOH/1 g·solid or greater.

In addition, in terms of the dispersion stability of the abrasive grains, the amine value of the polyamide-polyamine polymer used is preferably 3000 mg KOH/1 g·solid or less, more preferably 2000 mg KOH/1 g·solid or less, and most preferably 1000 mg KOH/1 g·solid or less.

The amine value of a water-soluble polymer is the number of mg of potassium hydroxide (KOH) equivalent to hydrochloric acid required to neutralize primary, secondary, and tertiary amines contained in the water-soluble polymer in unit weight.

The amine value of a water-soluble polymer can be measured, for example, as follows. First, water is added to 1.0 g of solid of the water-soluble polymer to provide 100 g of the mixture. Next, a 0.1 normal aqueous solution of sodium hydroxide is added thereto to make a sample having a pH adjusted to 11.0. Then, the sample is titrated with 0.5 normal hydrochloric acid, and the amount of the hydrochloric acid dripped to pH 10 and the amount of the hydrochloric acid dripped to pH 5 are measured. Then, the amine value can be obtained from the following formula:

$$\text{Amine value} = ((V5 - V10) \times F \times 0.5 \times 56.1)/S$$

where

V10: the amount (cc) of 0.5 normal hydrochloric acid dripped to pH 10,

V5: the amount (cc) of 0.5 normal hydrochloric acid dripped to pH 5,

F: the titer of 0.5 normal hydrochloric acid used for titration,

S: the amount (g) of the solid of the water-soluble polymer, 0.5: the normality of hydrochloric acid used for titration, and 56.1: the molecular weight of potassium hydroxide.

A method for producing a polyamide-polyamine polymer is disclosed, for example, in Japanese Patent No. 3666442 and Japanese Patent No. 4178500. Specifically, a polyamide-polyamine polymer obtained by reacting a polybasic acid and/or a lower alkyl ester thereof with a polyalkylenepolyamine can be used.

Examples of polybasic acids that can be used as a comonomer in the production of a polyamide-polyamine polymer include compounds represented by the following general formula (1):

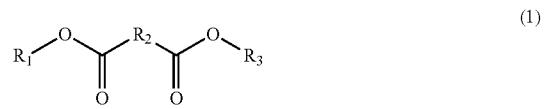

where $R_1$ and $R_3$ each independently represent a hydrogen atom or an unsubstituted or substituted straight chain alkyl group having 1 to 4 carbon atoms, and $R_2$ represents an unsubstituted or substituted straight chain alkyl group having 1 to 4 carbon atoms. When $R_1$ and $R_3$ are each a substituted straight chain alkyl group, the substituent of the side chain may be any of a methyl group, an ethyl group, a hydroxyl group, an amino group, a carboxyl group, a phenyl group, an acetyl group, a hydroxymethyl group, and a hydroxyethyl group.

Specific examples of polybasic acids represented by general formula (1) include: aliphatic saturated dibasic acids, such as oxalic acid, malonic acid, succinic acid, glutaric acid, adipic acid, pimelic acid, suberic acid, azelaic acid, and sebacic acid; aliphatic unsaturated polybasic acids, such as maleic acid, fumaric acid, itaconic acid, and alkenylsuccinic acids; hydroxypolybasic acids, such as glycolic acid, lactic acid, hydracrylic acid, α-hydroxybutyric acid, β-hydroxybutyric acid, α-hydroxyisobutyric acid, 2-hydroxypropionic acid, α-hydroxyisocaproic acid, β,β,β-trichlorolactic acid, glyceric acid, malic acid, α-methylmalic acid, tartaric acid, citric acid, tartronic acid, tetrahydroxysuccinic acid, β-hydroxyglutaric acid, hydroxymalonic acid, and gluconic acid; polymerized fatty acids, such as dimer acids and polymerized castor oil fatty acid; and tribasic acids, such as trimellitic acid. A plurality of types of these polybasic acids may be used in combination.

Among them, preferred polybasic acids are aliphatic saturated dibasic acids. Oxalic acid, malonic acid, succinic acid, glutaric acid, and adipic acid are particularly preferred, and succinic acid is most preferred.

Examples of a lower alkyl ester of a polybasic acid include methyl esters, ethyl esters, propyl esters, and butyl esters of polybasic acids represented by general formula (I).

Examples of polyalkylenepolyamines that can be used as a comonomer in the production of a polyamide-polyamine polymer include compounds having two or more amino groups each capable of forming an amide bond. Specific examples of such compounds include diethylenetriamine, triethylenetetramine, tetraethylenepentamine, iminobispropylamine, dimethylaminoethylamine, dimethylaminopropylamine, diethylaminoethylamine, diethylaminopropylamine, dibutylaminopropylamine, ethylaminoethylamine, 1,2-diaminopropane, 1,3-diaminopropane, 1,4-diaminobutane, methylaminopropylamine, diethylenetriamine, triethylenetetramine, tetraethylenepentamine, pentaethylenehexamine, dipropylenetriamine, tripropylenetetramine, 2-hydroxyaminopropylamine, methylbis-(3-aminopropyl)amine, dimethylaminoethoxypropylamine, 1,2-bis-(3-aminopropoxy)-ethane, 1,3-bis-(3-aminopropoxy)-2,2-dimethylpropane, α,ω-bis-(3-aminopropoxy)-polyethylene glycol ether, iminobispropylamine, methyliminobispropylamine, laurylaminopropylamine, diethanolaminopropylamine, N-aminoethylpiperidine, N-aminoethylpipecoline, N-aminoethylmorpholine, N-aminopropylpiperindine, N-aminopropyl-2-pipecoline, N-aminopropyl-4-pipecoline, N-aminopropyl-4-morpholine, and N-aminopropylmorpholine.

The number of consecutive carbon atoms between nitrogen atoms in the molecule of a polyalkylenepolyamine is preferably 4 or less, more preferably 3 or less. Ethylenediamine, diethylenetriamine, triethylenetetramine, tetraethylenepentamine, pentaethylenehexamine, and methylbis(3-aminopropyl)amine can all be favorably used because the number of consecutive carbon atoms between nitrogen atoms is 2.

The reaction molar ratio of the polyalkylenepolyamine to the polybasic acid and/or a lower alkyl ester thereof is preferably 0.1/1 to 10/1, more preferably 0.2/1 to 8/1, and further preferably 0.5/1 to 5/1. As the ratio of the polyalkylenepolyamine increases, it becomes easier for the obtained polyamide-polyamine polymer to form a protective film on the surface of the conductor layer of an object-to-be-polished, and depressions are further inhibited from being formed on the sides of traces formed by polishing using the polishing composition. As the ratio of the polybasic acid and/or a lower alkyl ester thereof increases, an improvement in the stability of the abrasive grains are more expected.

The polyamide-polyamine polymer may be modified with urea, epihalohydrin, or the like.

The weight average molecular weight of the water-soluble polymer in the polishing composition is appropriately set according to, for example, the amount of the polishing accelerator and the amount of the oxidizing agent contained in the polishing composition. Generally, the weight average molecular weight is preferably 100 or greater, more preferably 200 or greater, and further preferably 300 or greater. As the weight average molecular weight of the water-soluble polymer increases, depressions are further inhibited from being formed on the sides of traces formed by polishing using the polishing composition.

The weight average molecular weight of the water-soluble polymer in the polishing composition is also preferably 20,000 or less, more preferably 10,000 or less, and further preferably 5,000 or less. As the weight average molecular weight of the water-soluble polymer decreases, the material cost of the polishing composition is reduced. In addition, dishing is inhibited from occurring on the surface of an object-to-be-polished after polishing using the polishing composition.

The measurement of the weight average molecular weight of a water-soluble polymer can be performed by a general method, such as the GPC-MALS method. In the case of a water-soluble polymer having a relatively low molecular weight, the weight average molecular weight may be measured by the NMR method.

The content of the water-soluble polymer in the polishing composition is also appropriately set according to, for example, the amount of the polishing accelerator and the amount of the oxidizing agent contained in the polishing composition. Generally, the content of the water-soluble polymer is preferably 0.001 g/L or greater, more preferably 0.01 g/L or greater, and further preferably 0.05 g/L or greater. As the content of the water-soluble polymer increases, depressions are further inhibited from being formed on the sides of traces formed by polishing using the polishing composition.

The content of the water-soluble polymer in the polishing composition is also preferably 1 g/L or less, more preferably 0.5 g/L or less, further preferably 0.3 g/L or less, and most preferably 0.1 g/L or less. As the content of the water-soluble polymer decreases, the material cost of the polishing composition is reduced. In addition, dishing is inhibited from occurring on the surface of an object-to-be-polished after polishing using the polishing composition.

(Polishing Accelerator)

The polishing accelerator contained in the polishing composition has the action of chemically etching the surface of an object-to-be-polished, and improves the rate of polishing the object-to-be-polished with the polishing composition.

Polishing accelerators that can be used are, for example, inorganic acids, organic acids, amino acids, and chelating agents.

Specific examples of the inorganic acids include sulfuric acid, nitric acid, boric acid, carbonic acid, hypophosphorous acid, phosphorous acid, and phosphoric acid.

Specific examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid. Organic sulfuric acids, such as methanesulfonic acid, ethanesulfonic acid, and isethionic acid, can also be used.

Instead of an inorganic acid or an organic acid, or in combination with an inorganic acid or an organic acid, a salt, such as an ammonium salt or an alkali metal salt of an inorganic acid or an organic acid, may be used. In the case of a combination of a weak acid and a strong base, a strong acid and a weak base, or a weak acid and a weak base, pH buffer action is expected.

Specific examples of the amino acids include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lycine, taurine, serine, threonine, homoserine, tyrosine, bicine, tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lycine, creatine, histidine, 1-methyl-histidine, 3-methyl-histidine, and tryptophan. Among them, glycine, N-methylglycine, N,N-dimethylglycine, α-alanine, β-alanine, bicine, and tricine are preferred, and glycine is particularly preferred.

Specific examples of the chelating agents include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropanetetraacetic acid, glycol ether diaminetetraacetic acid, ethylenediamineorthohydroxyphenylacetic acid, ethylenediaminedisuccinic acid (SS form), N-(2-carboxylatoethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzil) ethylenediamine-N,N'-diacetic acid, and 1,2-dihydroxybenzene-4,6-disulfonic acid.

The content of the polishing accelerator in the polishing composition is preferably 0.01 g/L or greater, more preferably 0.1 g/L or greater, and further preferably 1 g/L or greater. As the content of the polishing accelerator increases, the rate of polishing an object-to-be-polished with the polishing composition is improved.

The content of the polishing accelerator in the polishing composition is also preferably 50 g/L or less, more preferably 30 g/L or less, and further preferably 15 g/L or less. As the content of the polishing accelerator decreases, excessive etching of the surface of an object-to-be-polished with the polishing accelerator is further inhibited from occurring.

(Oxidizing Agent)

The oxidizing agent contained in the polishing composition has the action of oxidizing the surface of an object-to-be-polished, and improves the rate of polishing the object-to-be-polished with the polishing composition.

Oxidizing agents that can be used are, for example, peroxides. Specific examples of the peroxides include hydrogen peroxide, peracetic acid, percarbonates, urea peroxide, perchloric acid, and persulfates, such as sodium persulfate, potassium persulfate, and ammonium persulfate. Among them, a persulfate and hydrogen peroxide are preferred, and hydrogen peroxide is particularly preferred.

The content of the oxidizing agent in the polishing composition is preferably 0.1 g/L or greater, more preferably 1 g/L or greater, and further preferably 3 g/L or greater. As the content of the oxidizing agent increases, the rate of polishing an object-to-be-polished with the polishing composition is improved.

The content of the oxidizing agent in the polishing composition is also preferably 200 g/L or less, more preferably 100 g/L or less, and further preferably 40 g/L or less. As the content of the oxidizing agent decreases, the material cost of the polishing composition is reduced. In addition, the load of the treatment of the polishing composition after being used for polishing, that is, waste liquid treatment, is reduced. Also, the likelihood of excessive oxidation of the surface of an object-to-be-polished with the oxidizing agent is reduced.

(Metal Anticorrosive Agent)

When a metal anticorrosive agent is added to the polishing composition, depressions are further inhibited from being formed on the sides of traces formed by polishing using the polishing composition. In addition, dishing is further inhibited from occurring on the surface of an object-to-be-polished, after polishing using the polishing composition.

Metal anticorrosive agents that can be used are not particularly limited, and are preferably heterocyclic compounds or surfactants. The number of members of a heterocycle in a heterocyclic compound is not particularly limited. The heterocyclic compounds may be monocyclic compounds or polycyclic compounds having a condensed ring.

Specific examples of heterocyclic compounds that can be used as a protective film-forming agent include nitrogen-containing heterocyclic compounds, such as pyrrole, pyrazole, imidazole, triazole, tetrazole, pyridine, pyrazine, pyridazine, pyrindine, indolizine, indole, isoindole, indazole, purine, quinolizine, quinoline, isoquinoline, naphthyridine, phthalazine, quinoxaline, quinazoline, cinnoline, buterizine, thiazole, isothiazole, oxazole, isoxazole, and furazan.

Examples of pyrazoles include 1H-pyrazole, 4-nitro-3-pyrazolecarboxylic acid, 3,5-pyrazolecarboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-amino-pyrazolo[3,4-d]pyrimidine, allopurinol, 4-chloro-1H-pyrazolo[3,4-D]pyrimidine, 3,4-dihydroxy-6-methylpyrazolo(3,4-B)-pyridine, and 6-methyl-1H-pyrazolo[3,4-b]pyridine-3-amine.

Examples of imidazoles include imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethylbenzimidazole, 2-aminobenzimidazole, 2-chlorobenzimidazole, 2-methylbenzimidazole, 2-(1-hydroxyethyl)benzimidazole, 2-hydroxybenzimidazole, 2-phenylbenzimidazole, 2,5-dimethylbenzimidazole, 5-methylbenzimidazole, 5-nitrobenzimidazole, and 1H-purine.

Examples of triazoles include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, and 1-[N,N-bis(hydroxyethyl)aminomethyl]-4-methylbenzotriazole.

Examples of tetrazoles include 1H-tetrazole, 5-methyltetrazole, 5-aminotetrazole, and 5-phenyltetrazole.

Examples of indazoles include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, and 3-carboxy-5-methyl-1H-indazole.

Examples of indoles include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, and 5-chloro-2-methyl-1H-indole.

Among them, preferred heterocyclic compounds are compounds having a triazole skeleton, and especially, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, and 1,2,4-triazole are particularly preferred. These heterocyclic compounds have high chemical or physical adsorbability to the surface of an object-to-be-polished, and therefore form a stronger protective film on the surface of an object-to-be-polished. This is advantageous to improve the flatness of the surface of an object-to-be-polished, after polishing using the polishing composition.

Surfactants used as a protective film-forming agent may be any of anionic surfactants, cationic surfactants, amphoteric surfactants, and nonionic surfactants.

Examples of the anionic surfactants include polyoxyethylene alkyl ether acetic acids, polyoxyethylene alkyl sulfates, alkyl sulfates, polyoxyethylene alkylsulfuric acids, alkylsulfuric acids, alkylbenzenesulfonic acids, alkyl phosphates, polyoxyethylene alkyl phosphates, polyoxyethylene sulfosuccinic acid, alkylsulfosuccinic acids, alkylnaphthalenesulfonic acids, alkyl diphenyl ether disulfonic acids, and salts thereof.

Examples of the cationic surfactants include alkyltrimethylammonium salts, alkyldimethylammonium salts, alkylbenzyldimethylammonium salts, and alkylamine salts.

Examples of the amphoteric surfactants include alkylbetaines and alkylamine oxides.

Examples of the nonionic surfactants include polyoxyethylene alkyl ethers, polyoxyalkylene alkyl ethers, sorbitan fatty acid esters, glycerin fatty acid esters, polyoxyethylene fatty acid esters, polyoxyethylene alkylamines, and alkylalkanolamides.

Among them, preferred surfactants are polyoxyethylene alkyl ether acetic acids, polyoxyethylene alkyl ether sulfates, alkyl ether sulfates, alkylbenzene sulfonates, and polyoxyethylene alkyl ethers. These surfactants have high chemical or physical adsorbability to the surface of an object-to-be-polished, and therefore form a stronger protective film on the surface of an object-to-be-polished. This is advantageous to improve the flatness of the surface of an object-to-be-polished, after polishing using the polishing composition.

The content of the metal anticorrosive agent in the polishing composition is preferably 0.001 g/L or greater, more preferably 0.005 g/L or greater, and further preferably 0.01 g/L or greater. As the content of the metal anticorrosive agent increases, the flatness of the surface of an object-to-be-polished after polishing using the polishing composition is further improved.

The content of the metal anticorrosive agent in the polishing composition is also preferably 10 g/L or less, more preferably 5 g/L or less, and further preferably 1 g/L or less. As the content of the metal anticorrosive agent decreases, the rate of polishing an object-to-be-polished with the polishing composition is further improved.

(Abrasive Grains)

The abrasive grains optionally contained in the polishing composition have the action of mechanically polishing an object-to-be-polished, and improves the rate of polishing the object-to-be-polished with the polishing composition.

The abrasive grains used may be any of inorganic particles, organic particles, and organic-inorganic composite particles. Specific examples of the inorganic particles include particles of metal oxides, such as silica, alumina, ceria, and titania, silicon nitride particles, silicon carbide particles, and boron nitride particles. Among them, silica is preferred, and colloidal silica is particularly preferred. Specific examples of the organic particles include polymethyl methacrylate (PMMA) particles.

The average primary particle size of the abrasive grains used is preferably 5 nm or greater, more preferably 7 nm or greater, and further preferably 10 nm or greater. As the average primary particle size of the abrasive grains increases, the rate of polishing an object-to-be-polished with the polishing composition is improved.

The average primary particle size of the abrasive grains used is also preferably 100 nm or less, more preferably 60 nm or less, and further preferably 40 nm or less. As the average primary particle size of the abrasive grains decreases, dishing is further inhibited from occurring on the surface of an object-to-be-polished after polishing using the polishing composition. The value of the average primary particle size of the abrasive grains is calculated based on, for example, the specific surface area of the abrasive grains measured by the BET method.

The content of the abrasive grains in the polishing composition is preferably 0.005% by mass or greater, more preferably 0.01% by mass or greater, and further preferably 0.05% by mass or greater. As the content of the abrasive grains increases, the rate of polishing an object-to-be-polished with the polishing composition is improved.

The content of the abrasive grains in the polishing composition is also preferably 5% by mass or less, more preferably 1% by mass or less, and further preferably 0.5% by mass or less. As the content of the abrasive grains decreases, the material cost of the polishing composition is reduced. In addition, dishing is inhibited from occurring on the surface of an object-to-be-polished after polishing using the polishing composition.

(pH of Polishing Composition)

The pH of the polishing composition is preferably 3 or greater, more preferably 5 or greater. As the pH of the polishing composition increases, the likelihood of excessive etching of the surface of an object-to-be-polished with the polishing composition is reduced.

The pH of the polishing composition is also preferably 9 or less, more preferably 8 or less. As the pH of the polishing composition decreases, depressions are further inhibited from being formed on the sides of traces formed by polishing using the polishing composition.

According to this embodiment, the following advantage is obtained.

The polishing composition in this embodiment contains a polyamide-polyamine polymer having an amine value of 150 mg KOH/1 g·solid or greater. Therefore, due to the function of this polyamide-polyamine polymer, depressions are inhibited from being formed on the sides of traces formed by polishing using the polishing composition. Accordingly, the polishing composition in this embodiment can be favorably used in polishing for forming wiring on a semiconductor device.

The above embodiment may be modified as follows.

The polishing composition in the above embodiment may contain two or more types of polishing accelerators.

The polishing composition in the above embodiment may contain two or more types of water-soluble polymers. In this case, some water-soluble polymers need not necessarily be polyamide-polyamine polymers having an amine value of 150 mg KOH/1 g·solid or greater. Specific examples of such water-soluble polymers include: polysaccharides, such as alginic acid, pectic acid, carboxymethyl cellulose, curdlan, and pullulan; polycarboxylic acids and salts thereof; vinyl polymers, such as polyvinyl alcohol, polyvinylpyrrolidone, and polyacrolein; polyglycerin; and polyglycerin esters. A case where a water-soluble polymer other than polyamide-polyamine polymers is added to the polishing composition is advantageous in that the water-soluble polymer can be adsorbed on the surface of abrasive grains or the surface of an object-to-be-polished, to control the rate of polishing the object-to-be-polished with the polishing composition. In addition, insoluble components produced during polishing are stabilized in the polishing composition.

The polishing composition in the above embodiment may contain two or more types of oxidizing agents.

The polishing composition in the above embodiment may contain two or more types of abrasive grains.

The polishing composition in the above embodiment may contain two or more types of metal anticorrosive agents. In this case, for example, two or more types of heterocyclic compounds may be used, or two or more types of surfactants may be used. Alternatively, a heterocyclic compound and a surfactant may be used in combination. When a heterocyclic compound and a surfactant are used in combination, that is, when the polishing composition contains a heterocyclic compound and a surfactant, an improvement in the rate of polishing an object-to-be-polished with the polishing composition and an improvement in the flatness of the surface of an object-to-be-polished after polishing using the polishing composition are both easily achieved.

The polishing composition in the above embodiment may further contain publicly known additives, such as preservatives and fungicides, as required. Specific examples of the preservatives and the fungicides include: isothiazoline preservatives, such as 2-methyl-4-isothiazoline-3-one and 5-chloro-2-methyl-4-isothiazoline-3-one; para-oxybenzoates; and phenoxyethanol.

The polishing composition in the above embodiment may be a one-component type, or a multi-component type including a two-component type.

The polishing composition in the above embodiment may be prepared by diluting an undiluted solution of the polishing composition, for example, 10 times or more, with a diluent, such as water.

The polishing composition in the above embodiment may be used in applications other than polishing for forming wiring on a semiconductor device.

Next, examples and comparative examples of the present invention will be described.

A water-soluble polymer, a polishing accelerator, an oxidizing agent, a metal anticorrosive agent, and abrasive grains were mixed into water to prepare polishing compositions of Examples 1 to 28 and Comparative Examples 1 to 12. A polishing accelerator, an oxidizing agent, a metal anticorrosive agent, and abrasive grains were mixed into water to prepare a polishing composition of Comparative Example 13. The details of the water-soluble polymer in each polishing composition are shown in Table 1. Although not shown in Table 1, the polishing compositions of Examples 1 to 28 and Comparative Examples 1 to 13 all contained 10 g/L of glycine as the polishing accelerator, 15 g/L of hydrogen peroxide as the oxidizing agent, and 0.1% by mass of colloidal silica having an average primary particle size of 30 nm as the abrasive grains. Further, the polishing compositions of Examples 1 to 28 and Comparative Examples 1 to 13 all contained 0.08 g/L of a mixture of 1-[N,N-bis(hydroxyethyl)aminomethyl]-5-methylbenzotriazole and 1-[N,N-bis(hydroxyethyl)aminomethyl]-5-methylbenzotriazole, 0.1 g/L of ammonium lauryl ether sulfate, and 0.5 g/L of a polyoxyethylene alkyl ether, as the metal anticorrosives, and some of them further contain an additional metal anticorrosive agent. The details of the additional metal anticorrosive agent contained in some polishing compositions are also shown in Table 1.

TABLE 1

| | | Water-soluble polymer | | | Additional metal anticorrosive agent | |
|---|---|---|---|---|---|---|
| | Type | Amine value [mg KOH/1 g solid] | Molecular weight | Content [g/L] | Type | Content [g/L] |
| Example 1 | Polyamide-polyamine polymer obtained by reaction of succinic acid with triethylenetetramine | 510 | 300 | 0.08 | 1,2,4-Triazole | 0.06 |
| Example 2 | Polyamide-polyamine polymer obtained by reaction of succinic acid with triethylenetetramine | 510 | 5000 | 0.08 | 1,2,4-Triazole | 0.06 |
| Example 3 | Polyamide-polyamine polymer obtained by reaction of succinic acid with diethylenetriamine | 450 | 5000 | 0.02 | 1,2,4-Triazole | 0.06 |
| Example 4 | Polyamide-polyamine polymer obtained by reaction of succinic acid with diethylenetriamine | 450 | 300 | 0.08 | 1,2,4-Triazole | 0.06 |
| Example 5 | Polyamide-polyamine polymer obtained by reaction of succinic acid with diethylenetriamine | 450 | 5000 | 0.08 | 1,2,4-Triazole | 0.06 |

TABLE 1-continued

| | Water-soluble polymer | | | | Additional metal anticorrosive agent | |
|---|---|---|---|---|---|---|
| | Type | Amine value [mg KOH/1 g solid] | Molecular weight | Content [g/L] | Type | Content [g/L] |
| Example 6 | Polyamide-polyamine polymer obtained by reaction of succinic acid with diethylenetriamine | 450 | 5000 | 0.10 | 1,2,4-Triazole | 0.06 |
| Example 7 | Polyamide-polyamine polymer obtained by reaction of succinic acid with diethylenetriamine | 450 | 5000 | 0.13 | 1,2,4-Triazole | 0.06 |
| Example 8 | Polyamide-polyamine polymer obtained by reaction of succinic acid with diethylenetriamine | 450 | 5000 | 0.24 | 1,2,4-Triazole | 0.06 |
| Example 9 | Polyamide-polyamine polymer obtained by reaction of succinic acid with diethylenetriamine | 450 | 5000 | 0.13 | 1,2,4-Triazole | 0.03 |
| Example 10 | Polyamide-polyamine polymer obtained by reaction of succinic acid with diethylenetriamine | 450 | 5000 | 0.08 | 1,2,3-Triazole | 0.06 |
| Example 11 | Polyamide-polyamine polymer obtained by reaction of succinic acid with diethylenetriamine | 450 | 5000 | 0.08 | 3-Amino-1,2,4-triazole | 0.06 |
| Example 12 | Polyamide-polyamine polymer obtained by reaction of succinic acid with methylbis(3-aminopropyl)amine | 360 | 5000 | 0.08 | 1,2,4-Triazole | 0.06 |
| Example 13 | Polyamide-polyamine polymer obtained by reaction of succinic acid with methylbis(3-aminopropyl)amine | 360 | 5000 | 0.13 | 1,2,4-Triazole | 0.06 |
| Example 14 | Polyamide-polyamine polymer obtained by reaction of succinic acid with triethylenetetramine | 510 | 5000 | 0.13 | — | 0.06 |
| Example 15 | Polyamide-polyamine polymer obtained by reaction of succinic acid with diethylenetriamine | 450 | 5000 | 0.13 | — | 0.06 |
| Example 16 | Polyamide-polyamine polymer obtained by reaction of succinic acid with methylbis(3-aminopropyl)amine | 360 | 5000 | 0.13 | — | 0.06 |
| Example 17 | Polyamide-polyamine polymer obtained by reaction of glutaric acid with triethylenetetramine | 340 | 4000 | 0.24 | 1,2,4-Triazole | 0.06 |
| Example 18 | Polyamide-polyamine polymer obtained by reaction of glutaric acid with diethylenetriamine | 310 | 6000 | 0.24 | 1,2,4-Triazole | 0.06 |
| Example 19 | Polyamide-polyamine polymer obtained by reaction of glutaric acid with methylbis(3-aminopropyl)amine | 220 | 5000 | 0.24 | 1,2,4-Triazole | 0.06 |
| Example 20 | Polyamide-polyamine polymer obtained by reaction of adipic acid with diethylenetriamine | 330 | 4000 | 0.24 | 1,2,4-Triazole | 0.06 |
| Example 21 | Polyamide-polyamine polymer obtained by reaction of adipic acid with diethylenetriamine | 280 | 5000 | 0.24 | 1,2,4-Triazole | 0.06 |
| Example 22 | Polyamide-polyamine polymer obtained by reaction of adipic acid with diethylenetriamine | 220 | 5000 | 0.06 | 1,2,4-Triazole | 0.06 |
| Example 23 | Polyamide-polyamine polymer obtained by reaction of adipic acid with diethylenetriamine | 220 | 5000 | 0.12 | 1,2,4-Triazole | 0.06 |
| Example 24 | Polyamide-polyamine polymer obtained by reaction of adipic acid with diethylenetriamine | 220 | 5000 | 0.24 | 1,2,4-Triazole | 0.06 |
| Example 25 | Polyamide-polyamine polymer obtained by reaction of adipic acid with diethylenetriamine | 220 | 5000 | 0.24 | 1,2,4-Triazole | 0.15 |
| Example 26 | Urea-modified polyamide-polyamine polymer obtained by reaction of adipic acid with diethylenetriamine | 190 | 7000 | 0.24 | 1,2,4-Triazole | 0.06 |
| Example 27 | Epihalohydrin-modified polyamide-polyamine polymer obtained by reaction of adipic acid with diethylenetriamine | 180 | 800000 | 0.24 | 1,2,4-Triazole | 0.06 |
| Example 28 | Urea and epihalohydrin-modified polyamide-polyamine polymer obtained by reaction of adipic acid with diethylenetriamine | 160 | 600000 | 0.24 | 1,2,4-Triazole | 0.06 |
| Comparative Example 1 | Polyamide-polyamine polymer obtained by reaction of adipic acid with diethylenetriamine | 100 | 5000 | 0.24 | 1,2,4-Triazole | 0.06 |

TABLE 1-continued

|  | Water-soluble polymer | | | | Additional metal anticorrosive agent | |
|---|---|---|---|---|---|---|
|  | Type | Amine value [mg KOH/1 g solid] | Molecular weight | Content [g/L] | Type | Content [g/L] |
| Comparative Example 2 | Epihalohydrin-modified polyamide-polyamine polymer obtained by reaction of adipic acid with diethylenetriamine | 90 | 300000 | 0.24 | 1,2,4-Triazole | 0.06 |
| Comparative Example 3 | Urea-modified polyamide-polyamine polymer obtained by reaction of adipic acid with diethylenetriamine | 50 | 5000 | 0.24 | 1,2,4-Triazole | 0.06 |
| Comparative Example 4 | Polyamide-polyamine polymer obtained by reaction of adipic acid with methylbis(3-aminopropyl)amine | 50 | 3000 | 0.24 | 1,2,4-Triazole | 0.06 |
| Comparative Example 5 | Polyamide-polyamine polymer obtained by reaction of pimelic acid with diethylenetriamine | 140 | 5000 | 0.24 | 1,2,4-Triazole | 0.06 |
| Comparative Example 6 | Polyamide-polyamine polymer obtained by reaction of pimelic acid with methylbis(3-aminopropyl)amine | 120 | 5000 | 0.24 | 1,2,4-Triazole | 0.06 |
| Comparative Example 7 | Polyethyleneimine | 950 | 1800 | 0.24 | 1,2,4-Triazole | 0.06 |
| Comparative Example 8 | Polyethyleneimine | 640 | 10000 | 0.24 | 1,2,4-Triazole | 0.06 |
| Comparative Example 9 | Poly[(2-hydroxypropyl)chloride]dimethylammonium | 230 | 5000 | 0.24 | 1,2,4-Triazole | 0.06 |
| Comparative Example 10 | Epihalohydrin-modified dimethylamine-ethylenediamine-epichlorohydrin copolymer | 300 | 5000 | 0.24 | 1,2,4-Triazole | 0.06 |
| Comparative Example 11 | Polydiallyldimethylammonium chloride | 250 | 9000 | 0.24 | 1,2,4-Triazole | 0.06 |
| Comparative Example 12 | Polydiallyldimethylammonium chloride | 50 | 300000 | 0.24 | 1,2,4-Triazole | 0.06 |
| Comparative Example 13 | — | — | — | — | 1,2,4-Triazole | 0.06 |

<Depressions on Sides of Traces>

Using each polishing composition, the surface of a copper pattern wafer (ATDF 754 mask, copper film thickness before polishing: 700 nm, trench depth: 300 nm) was polished under first polishing conditions described in Table 2 until the copper film thickness reached 250 nm. Then, the surface of the copper pattern wafer after the polishing was polished under second polishing conditions described in Table 3 using the same polishing composition until the barrier film was exposed. The surface of the copper pattern wafer after the two-stage polishing was performed in this manner was observed using a review SEM (RS-4000 manufactured by Hitachi High-Technologies Corporation), and in a region where traces having a width of 0.18 μm and insulating films having a width of 0.18 μm were alternately arranged and a region where traces having a width of 100 μm and insulating films having a width of 100 μm were alternately arranged, the presence or absence of depressions on the sides of the traces was checked. Then, a case where no depressions on the sides of the traces were found in either region was evaluated as ◯◯◯ (outstanding), a case where depressions having a width of less than 5 nm on the sides of the traces were found only in either one region was evaluated as ◯◯ (excellent), a case where depressions having a width of less than 5 nm on the sides of the traces were found in both regions was evaluated as ◯ (good), a case where depressions having a width of 5 nm or greater and less than 50 nm on the sides of the traces were found in at least either one region was evaluated as x (slightly poor), and a case where depressions having a width of 50 nm or greater were found in at least either one region was evaluated as xx (poor). The results of this evaluation are shown in the "Depressions on sides of traces" column in Table 4.

<Surface Roughness>

Using each polishing composition, the surface of a copper pattern wafer (ATDF 754 mask, copper film thickness before polishing: 700 nm, trench depth: 300 nm) was polished under the first polishing conditions described in Table 2 until the copper film thickness reached 250 nm. Then, the surface of the copper pattern wafer after the polishing was polished under the second polishing conditions described in Table 3 using the same polishing composition until the barrier film was exposed. The surface roughness Ra near the center of an isolated trace portion having a width of 100 μm in the copper pattern wafer after the two-stage polishing was performed in this manner was measured using the scanning probe microscope "S-image" manufactured by SII NanoTechnology Inc. This measurement of the surface roughness Ra was performed in a DFM mode using a Si probe, and performed at 256 points in each of the vertical and horizontal directions in a 1 μm square region at a scan rate of 0.5 Hz. A case where the value of the measured Ra was less than 1.0 nm was evaluated as ◯◯◯ (excellent), a case where the value of the measured Ra was 1.0 nm or greater was evaluated as ◯◯ (good), a case where the value of the measured Ra was 1.5 nm or greater and less than 2.0 nm was evaluated as ◯ (fair), a case where the value of the measured Ra was 2.0 nm or greater was evaluated as x (poor). The results of this evaluation are shown in the "Surface roughness" column in Table 4.

<Polishing Rate>

Using each polishing composition, the surface of a copper blanket wafer was polished for 60 seconds under the first polishing conditions described in Table 2 and the second polishing conditions described in Table 3. The polishing rate under each of the first conditions and the second conditions at this time is shown in the "Polishing rate" column in Table 4. The value of the polishing rate was obtained by dividing by polishing time the difference in the thickness of the copper blanket wafer before and after polishing, measured using the sheet resistance measuring instrument "VR-120SD/8" manufactured by Hitachi Kokusai Electric Inc. It is needless to say that a larger value of the polishing rate is preferred, and 400 nm/min or greater in the case of the first polishing conditions, and 200 nm/min or greater in the case of the second polishing conditions are practical levels.

<Dishing>

Using each polishing composition, the surface of a copper pattern wafer (ATDF 754 mask, copper film thickness before polishing: 700 nm, trench depth: 300 nm) was polished under the first polishing conditions described in Table 2 until the remaining copper film reached 250 nm. Then, the surface of the copper pattern wafer after the polishing was polished under the second polishing conditions described in Table 3 using the same polishing composition, until the barrier film was exposed. In a first region where traces having a width of 9 μm and insulating films having a width of 1 μm were alternately arranged and a second region where traces having a width of 5 μm and insulating films having a width of 1 μm were alternately arranged, in the copper pattern wafer after the two-stage polishing was performed in this manner, the amount of dishing (the depth of dishing) was measured using the wide area AFM "WA-1300" manufactured by Hitachi Kenki FineTech Co., Ltd. The results of this measurement are shown in the "Dishing" column in Table 5 and Table 6. When the value of the amount of dishing measured is 200 nm or less in the case of the first polishing conditions 1, and 120 nm or less in the case of the second polishing conditions, they are practical levels.

TABLE 2

<First Polishing Conditions>

| | |
|---|---|
| Polishing machine: | Polisher for single-side CMP (Reflexion LK, from Applied Materials, Inc.) |
| Polishing pad: | Expanded polyurethane pad |
| Polishing pressure: | 2.7 psi (= approx. 18.6 kPa) |
| Surface plate rotational rate: | 90 rpm |
| Feed rate of polishing composition: | 300 mL/min |
| Number of revolutions of carrier: | 90 rpm |

TABLE 3

<Second Polishing Conditions>

| | |
|---|---|
| Polishing machine: | Polisher for single-side CMP (Reflexion LK, from Applied Materials, Inc.) |
| Polishing pad: | Expanded polyurethane pad |
| Polishing pressure: | 1.5 psi (= approx. 10.3 kPa) |
| Surface plate rotational rate: | 90 rpm |
| Feed rate of polishing composition: | 300 mL/min |
| Number of revolutions of carrier: | 90 rpm |

TABLE 4

| | Depressions on sides of traces | Surface roughness | Polishing rate [nm/min] | | Dishing [nm] | |
|---|---|---|---|---|---|---|
| | | | First polishing conditions | Second polishing conditions | First region | Second region |
| Example 1 | ○○○ | ○○○ | 505 | 390 | 89 | 60 |
| Example 2 | ○○○ | ○○○ | 507 | 387 | 90 | 59 |
| Example 3 | ○ | ○○ | 510 | 370 | 88 | 58 |
| Example 4 | ○○○ | ○○○ | 490 | 380 | 87 | 61 |
| Example 5 | ○○○ | ○○○ | 488 | 381 | 89 | 60 |
| Example 6 | ○○○ | ○○○ | 520 | 390 | 85 | 63 |
| Example 7 | ○○○ | ○○○ | 572 | 407 | 105 | 70 |
| Example 8 | ○○○ | ○○○ | 650 | 480 | 120 | 71 |
| Example 9 | ○○ | ○○○ | 610 | 414 | 69 | 50 |
| Example 10 | ○○ | ○○○ | 500 | 380 | 89 | 60 |
| Example 11 | ○○ | ○○○ | 500 | 380 | 89 | 59 |
| Example 12 | ○○ | ○○○ | 496 | 361 | 95 | 58 |
| Example 13 | ○○ | ○○○ | 609 | 453 | 126 | 78 |
| Example 14 | ○○ | ○○○ | 500 | 380 | 80 | 55 |
| Example 15 | ○○ | ○○○ | 510 | 384 | 71 | 54 |
| Example 16 | ○ | ○○○ | 620 | 500 | 130 | 78 |
| Example 17 | ○ | ○○ | 470 | 350 | 85 | 62 |
| Example 18 | ○ | ○○ | 471 | 350 | 80 | 63 |
| Example 19 | ○ | ○○ | 540 | 378 | 163 | 91 |
| Example 20 | ○ | ○ | 480 | 350 | 95 | 59 |
| Example 21 | ○ | ○ | 480 | 350 | 95 | 57 |
| Example 22 | ○ | ○ | 493 | 387 | 87 | 57 |
| Example 23 | ○ | ○ | 547 | 435 | 106 | 69 |
| Example 24 | ○ | ○ | 670 | 567 | 156 | 102 |
| Example 25 | ○ | ○ | 426 | 304 | 161 | 98 |
| Example 26 | ○ | ○ | 490 | 350 | 100 | 65 |
| Example 27 | ○ | ○ | 510 | 350 | 98 | 68 |
| Example 28 | ○ | ○ | 500 | 350 | 48 | 55 |
| Comparative Example 1 | x | x | 510 | 350 | 100 | 62 |
| Comparative Example 2 | x | x | 560 | 420 | 88 | 61 |
| Comparative Example 3 | xx | x | 520 | 350 | 95 | 60 |
| Comparative Example 4 | xx | ○○ | 560 | 370 | 156 | 90 |
| Comparative Example 5 | x | ○ | 400 | 260 | 100 | 60 |
| Comparative Example 6 | x | ○○ | 400 | 260 | 178 | 104 |
| Comparative Example 7 | ○ | x | 560 | 420 | 180 | 135 |

TABLE 4-continued

|  | Depressions on sides of traces | Surface roughness | Polishing rate [nm/min] | | Dishing [nm] | |
|---|---|---|---|---|---|---|
|  |  |  | First polishing conditions | Second polishing conditions | First region | Second region |
| Comparative Example 8 | ○ | x | 560 | 380 | 190 | 140 |
| Comparative Example 9 | xx | ○○ | 640 | 440 | 100 | 67 |
| Comparative Example 10 | x | ○ | 650 | 480 | 160 | 100 |
| Comparative Example 11 | xx | ○ | 510 | 370 | 110 | 60 |
| Comparative Example 12 | xx | ○ | 490 | 360 | 105 | 58 |
| Comparative Example 13 | xx | ○ | 510 | 370 | 98 | 58 |

The invention claimed is:

1. A polishing composition comprising a water-soluble polymer, a polishing accelerator, an oxidizing agent, and water, wherein the water-soluble polymer is a polyamide-polyamine polymer having an amine value of 150 mg KOH/1 g·solid or greater, and wherein the polyamide-polyamine polymer is present in the polishing composition in a form dissolved therein.

2. The polishing composition according to claim 1, wherein the water-soluble polymer contains as a comonomer a compound represented by the following general formula (1), where $R_1$ and $R_3$ each independently represent a hydrogen atom or an unsubstituted or substituted straight chain alkyl group having 1 to 4 carbon atoms, and $R_2$ represents an unsubstituted or substituted straight chain alkyl group having 1 to 4 carbon atoms

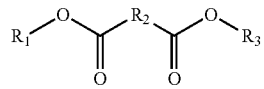

(1)

3. The polishing composition according to claim 2, wherein the compound represented by general formula (1) is glutaric acid or succinic acid.

4. The polishing composition according to claim 1, wherein the water-soluble polymer contains as a comonomer a polyalkylenepolyamine in which the number of consecutive carbon atoms between nitrogen atoms is 4 or less.

5. The polishing composition according to claim 1, further comprising a compound having a triazole skeleton.

6. A polishing method for polishing a surface of an object-to-be-polished that includes copper or a copper alloy, using a polishing composition according to claim 1.

* * * * *